US008922276B2

(12) United States Patent
Iwamoto

(10) Patent No.: US 8,922,276 B2
(45) Date of Patent: Dec. 30, 2014

(54) AUTO-ZERO AMPLIFIER AND FEEDBACK AMPLIFIER CIRCUIT USING THE AUTO-ZERO AMPLIFIER

(71) Applicant: Fuji Electric Co., Ltd., Kawasaki (JP)

(72) Inventor: Motomitsu Iwamoto, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 46 days.

(21) Appl. No.: 13/675,162

(22) Filed: Nov. 13, 2012

(65) Prior Publication Data
US 2013/0147553 A1    Jun. 13, 2013

(30) Foreign Application Priority Data

Dec. 9, 2011   (JP) ................................. 2011-269863

(51) Int. Cl.
*H03F 1/02* (2006.01)
*H03F 3/45* (2006.01)
*H03F 1/34* (2006.01)

(52) U.S. Cl.
CPC ............ *H03F 3/45179* (2013.01); *H03F 1/342* (2013.01); *H03F 3/45183* (2013.01); *H03F 3/45475* (2013.01); *H03F 3/45968* (2013.01); *H03F 3/45986* (2013.01); *H03F 2203/45536* (2013.01); *H03F 2203/45544* (2013.01); *H03F 2203/45562* (2013.01); *H03F 2203/45588* (2013.01); *H03F 2203/45614* (2013.01); *H03F 2203/45616* (2013.01); *H03F 2203/45618* (2013.01); *H03F 2203/45644* (2013.01); *H03F 2203/45674* (2013.01); *H03F 2203/45681* (2013.01); *H03F 2203/45684* (2013.01); *H03F 2203/45724* (2013.01)
USPC ............................................................ 330/9

(58) Field of Classification Search
CPC ............ H03F 3/45183; H03F 3/45179; H03F 2203/45248; H03F 3/082; H03F 3/45968; H03F 1/342; H03F 2203/45134; H03F 2203/45371; G09G 2310/0291; G11C 19/184; H03K 17/145; H03K 17/063; H03K 17/223
USPC ............................. 330/9, 252, 253, 257, 260
See application file for complete search history.

(56) References Cited

U.S. PATENT DOCUMENTS

| 8,604,762 | B2 * | 12/2013 | Bakkaloglu et al. | .......... 323/280 |
| 2003/0080809 | A1 * | 5/2003 | McGrath | ........................ 330/9 |
| 2003/0080810 | A1 * | 5/2003 | Reber | ............................. 330/9 |
| 2003/0193367 | A1 * | 10/2003 | Botker | ............................ 330/9 |

FOREIGN PATENT DOCUMENTS

JP     62-292013 A    12/1987
JP     2005-020291 A    1/2005

* cited by examiner

*Primary Examiner* — Kranh V Nguyen
(74) *Attorney, Agent, or Firm* — Rossi, Kimms & McDowell LLP

(57) ABSTRACT

In aspects of the invention, at normal operation, an operational amplifier circuit has feedback applied from the output thereof to the input thereof so that currents equal to each other flow in differential pair transistors, respectively. While, in order that currents equal to each other may flow in the differential pair transistors, respectively, for compensating the difference in threshold voltages in the differential pair transistors, a voltage lower by a certain voltage difference than the voltage applied to the gate terminal of the transistor must be applied to the gate terminal of the transistor. From this, the switching of switches, when a virtual short circuit occurs, can make the output voltage of the operational amplifier circuit become a signal in which positive and negative rectangular ripples, with the values thereof being proportional to the value of the certain voltage difference, are superimposed on a true value.

2 Claims, 6 Drawing Sheets

US 8,922,276 B2

AUTO-ZERO AMPLIFIER AND FEEDBACK AMPLIFIER CIRCUIT USING THE AUTO-ZERO AMPLIFIER

BACKGROUND OF THE INVENTION

1. Field of the Invention

Embodiments of the invention relate to auto-zero amplifiers and a feedback amplifier circuits using auto-zero amplifiers.

2. Related Art

FIGS. 8A-8C illustrate circuit diagrams showing a circuit configuration and operations of the circuit of an auto-zero amplifier as an OP (operational) amplifier circuit according to the related art.

The operations of the circuit of the auto-zero amplifier according to related art shown in FIG. 8(A) may be classified into two phases, one of which is a compensation phase as shown in FIG. 8(B) and the other one of which is an operation (actual use) phase as shown in FIG. 8(C).

First, the operation in the compensation phase shown in FIG. 8(B) will be explained. In the compensation phase shown in FIG. 8(B), with switches SW_A shown in FIG. 8(A) being closed, switches SW_B shown in FIG. 8(A) are opened. At this time, the circuit shown in FIG. 8(A) comes to form a voltage follower to an input voltage to a non-inverting (+) input terminal. The input voltage to the voltage follower circuit shown in FIG. 8(B), being 0 volt, causes an offset voltage of the OP amplifier circuit to be produced in the output voltage. Since the output terminal of the OP amplifier circuit is connected to the ground (GND) through a capacitor, the capacitor is charged by the offset voltage of the OP amplifier circuit.

Following this, the operation in the operation (actual use) phase shown in FIG. 8(C) will be explained. In the operation phase shown in FIG. 8(C), with switches SW_A shown in FIG. 8*(A) being opened, switches SW_B shown in FIG. 8(A) are closed. Then, the offset voltage due to the capacitor charged in the compensation phase shown in FIG. 8(B) and the offset voltage of the OP amplifier circuit shown in FIG. 8(C) come to be voltages canceled each other out to therefore produce no offset voltage in the output voltage of the OP amplifier circuit in the operation phase shown in FIG. 8(C), by which a highly accurate output voltage of an OP amplifier circuit can be obtained.

Incidentally, in Japanese Patent Application Publication No. JP-A-62-292013, a comparator circuit is disclosed, in which an OP amplifier circuit is used that produces no offset voltage in the output voltage similarly to the OP amplifier circuit shown in (A) of FIG. 8.

Moreover, in Japanese Patent Application Publication No. JP-A-2005-020291, an OP amplifier circuit is disclosed in which two OP amplifier circuits, each being similar to the OP amplifier circuit shown in FIG. 8(A), are prepared to make them alternately carry out a compensation operation and a normal operation between the two so as to thereby eliminate the time in which no normal operation is carried out.

With the related art as shown in FIGS. 8(A)-8(C), the operations of the OP amplifier circuit are periodically switched in order as "the compensation phase"→"the operation phase"→"the compensation phase"→"the operation phase"→ . . . , which therefore periodically produces a time in which the OP amplifier circuit is not operated as an OP amplifier circuit. In order to avoid this, there is an idea of bringing the operation of the OP amplifier circuit into the compensation phase only at the turning-on of the power supply so as to compensate the offset voltage and thereafter into the operation phase so as to continue the operation in the operation phase, for example. This, however, has a problem in that the compensation of the offset voltage due to a temperature drift becomes impossible. As another countermeasure, there is one in which two auto-zero amplifiers as OP amplifier circuits are prepared as shown in Japanese Patent Application Publication No. JP-A-2005-020291 for alternately switching the outputs thereof, for example. This, however, has a problem in that two auto-zero amplifiers are required to result in an increase in the scale of the circuit. Thus, certain problems and shortcomings exist in the related art.

SUMMARY OF THE INVENTION

Embodiments of the invention address these and other problems and shortcomings in the related art. Certain embodiments provide an auto-zero amplifier with a single OP amplifier circuit, which amplifier has no time of being operated as no OP amplifier circuit and is also capable of compensating a temperature drift.

Certain embodiments address the fact that the offset voltage of an OP amplifier circuit is produced by the difference between threshold voltages of two transistors referred to as a differential pair provided at the input section of the circuit and is based on the circuit configuration provided so that the operations of a pair of transistors at the input section of the circuit of the OP amplifier circuit are alternately switched every specified period of time.

According to certain embodiments, the output voltage of the OP amplifier circuit is to be outputted with positive and negative offset voltages alternately superimposed on the true value (a normal value without any errors) of the output voltage every specified period of time. Therefore, the value at the center between the maximum value and the minimum value of the output voltage becomes the true value of the output voltage. Hence, by connecting an LPF (low-pass filter) with a time constant sufficiently larger than the switching period of the pair of the transistors to the output of the OP amplifier circuit, the output of the OP amplifier circuit is made smoothed, which enables a voltage with an offset voltage being eliminated to be obtained as an output voltage.

DETAILED DESCRIPTION

In the following, explanations will be made in detail with respect to certain embodiments of the invention.

Figure 1:
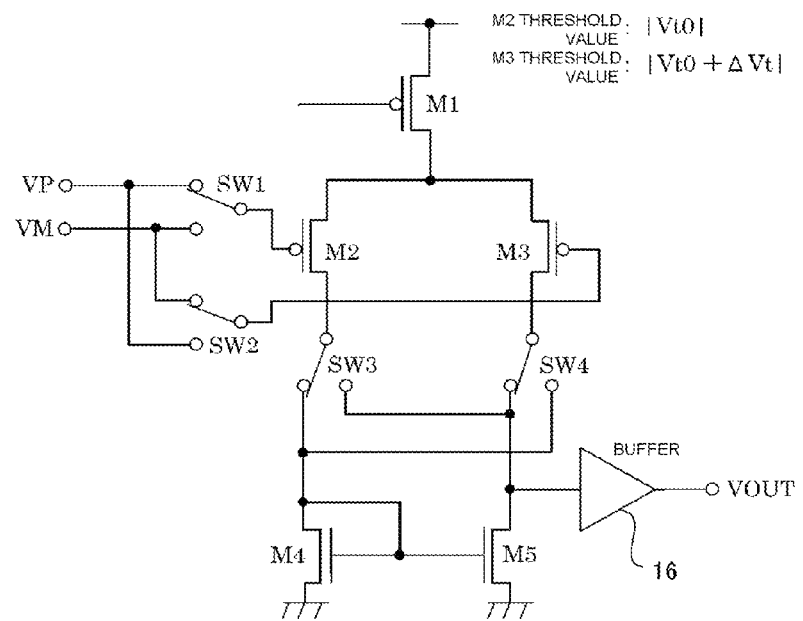
FIG. 1 is a circuit diagram (part 1) showing a circuit configuration of an auto-zero amplifier according to embodiments of the invention.

FIG. 1 is a circuit diagram (part 1) showing a circuit configuration of an auto-zero amplifier according to embodiments of the invention. Here, the circuit of the auto-zero amplifier shown in FIG. 1 is applicable to any feedback amplifier circuit using an OP amplifier circuit. Explanations will be made, however, with respect to an example of a positive phase amplifier circuit. Moreover, FIG. 2 is a circuit diagram (part 1) showing the whole circuit configuration of a feedback amplifier circuit using the circuit of the auto-zero amplifier shown in FIG. 1.

Figure 2:
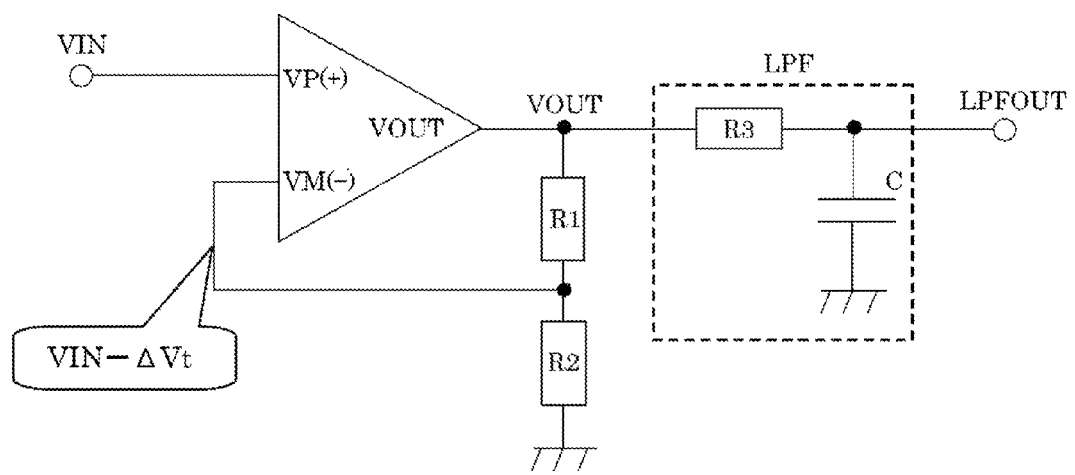
FIG. 2 is a circuit diagram (part 1) showing the whole configuration of a feedback amplifier circuit using the auto-zero amplifier shown in FIG. 1.

In FIG. 1 and FIG. 2, input terminals of the circuit of the auto-zero amplifier are designated as VP (non-inverting (+) input terminal) and VM (inverting (−) input terminal) and an output terminal of the circuit is designated as VOUT. In FIG. 1, reference sign M1 designates a constant current producing transistor that functions as a constant current source. The transistor M1 operates to make the sum of currents constant which flow in two transistors (differential pair transistors) M2 and M3 forming a differential pair the source terminals of which are connected to the drain terminal of the transistor M1. The transistors M1, M2 and M3 have the same conduction type (P-channel MOS transistors). The difference between the threshold voltages of the differential pair transistors M2 and M3 becomes an offset voltage to appear in the output voltage of the circuit of the auto-zero amplifier.

Moreover, in FIG. 1, reference signs M4 and M5 designate active load transistors, the gate terminals of which are connected to each other. The active load transistor M4 is in a diode connection with the gate terminal thereof further connected to the drain terminal thereof. In addition, each of the transistors M4 and M5 has a different conduction type (N-channel MOS transistor) from the conduction type of the transistors M1, M2 and M3. Reference signs SW1, SW2, SW3 and SW4 designate switches functioning to switch the connections to the differential pair transistors M2 and M3. By operating an input switching circuit formed of the switches SW1 and SW2, each of the gate terminals of the transistors M2 and M3 forming the differential pair is alternately connected to the non-inverting input terminal VP and the inverting input terminal VM. Namely, the switches SW1 and SW2 alternately carry out the switching between a first connection state and a second connection state. In the first connection state, the non-inverting input terminal VP is connected to the gate terminal of the transistor M2 and, along with this, the inverting input terminal VM is connected to the gate terminal of the transistor M3. In the second connection state, the inverting input terminal VM is connected to the gate terminal of the transistor M2 and, along with this, the non-inverting input terminal VP is connected to the gate terminal of the transistor M3.

Furthermore, by operating a differential switching circuit formed of the switches SW3 and SW4, each of the drain terminals of the transistors M2 and M3 forming the differential pair is alternately connected to a diode connection side node (drain terminal side node of the transistor M4) and to an output side node (drain terminal side node of the transistor M5). Namely, the switches SW3 and SW4 carry out the switching between a third connection state and a fourth connection state. In the third connection state, the drain terminal of the transistor M4 is connected to the drain terminal of the transistor M2 and, along with this, the drain terminal of the transistor M5 is connected to the drain terminal of the transistor M3. In the fourth connection state, the drain terminal of the transistor M4 is connected to the drain terminal of the transistor M3 and, along with this, the drain terminal of the transistor M5 is connected to the drain terminal of the transistor M2. Here, the first connection state and the third connection state are operated together (brought into the connection states at the same time) and the second connection state and the fourth connection state are operated together.

The output of the circuit formed of the differential pair transistors M2 and M3 is taken out from the drain terminal of the active load transistor M5 and outputted as an output VOUT from the output terminal VOUT through a buffer circuit 16. To a specific configuration of the buffer circuit 16, amplifier circuits such as a source follower and an AB class buffer can be applied, for example. However, the buffer circuit 16 itself exerts no influence on the offset voltage of the input voltage of the OP amplifier circuit. Thus, the configuration of the buffer circuit 16 is not limited to such an amplifier circuit but can be another kind of amplifier circuit.

Let the threshold voltage of one transistor M2 forming the differential pair be $|Vt0|$ and let the threshold voltage of the other transistor M3 forming the differential pair be $|Vt0+\Delta Vt|$.

First, the operation of the circuit of the auto-zero amplifier according to the invention will be explained with the use of FIG. 1 and FIG. 2. At a normal operation, the OP amplifier circuit has feedback applied from the output to the input so that currents equal to each other flow in the differential pair transistors M2 and M3, respectively.

This is due to the gate voltages of the transistors M4 and M5 being equal to each other which therefore make currents equal to each other flow in the active load transistors M4 and M5. Namely, if we let each of the currents in the active load transistors M4 and M5 be in a state of being unequal to the other, from the voltage-current characteristic of a MOS transistor, the source-drain voltage of a transistor with a larger current becomes very large. While, the source-drain voltage of a transistor with a smaller current becomes very small.

For example, when the current in the MOS transistor M5 is small with the non-inverting input terminal VP being connected to the gate terminal of the MOS transistor M2, the inverting input terminal VM being connected to the gate terminal of the MOS transistor M3, the MOS transistors M2 and M4 being connected and the MOS transistors M2 and M4 being connected by the operation of the switches SW1, SW2, SW3 and SW4, the output voltage VOUT at the output terminal VOUT becomes a low voltage, which is fed back to the input side (the gate terminal of the MOS transistor M3) through the inverting input terminal VM to function so as to increase the current in the MOS transistor M3 (i.e. the current in the MOS transistor M5). When the current in the MOS transistor M5 is large, the circuit is operated in reverse to equalize the resulting currents in the MOS transistors M4 and M5. Such an operation holds when the whole circuit configuration is given so that the two inputs to the OP amplifier circuit are in a virtual short circuit.

In a state 1 in which the connection states of the switches SW1, SW2, SW3 and SW4 become those shown in FIG. 1 to actualize the first connection state and the third connection state, in order that currents equal to each other may flow in the differential pair transistors M2 and M3, respectively, for compensating the difference in threshold voltages in the differential pair transistors M2 and M3, a voltage lower by $|\Delta Vt|$ than the voltage applied to the gate terminal of the transistor M2 must be applied to the gate terminal of the transistor M3 (the differential pair transistors M2 and M3 are P-channel MOS transistors). In the case of the state 1, the non-inverting input terminal VP of the auto-zero amplifier is connected to the gate terminal of the transistor M2 and the inverting input terminal VM of the auto-zero amplifier is connected to the gate terminal of the transistor M3. Therefore, when an input voltage VIN is applied to the non-inverting input terminal VP of the auto-zero amplifier, to the inverting input terminal VM of the auto-zero amplifier, a voltage of VIN−|ΔVt| must be applied. Therefore, the relation between the output voltage VOUT at the output terminal VOUT of the auto-zero amplifier and the input voltage VIN is given by the following expression $$VOUT\left(\frac{R2}{R1+R2}\right) = VIN - \Delta Vt \quad (1)$$

Thus, the output voltage VOUT is given by the following expression (2):

$$VOUT = \left(\frac{R1+R2}{R2}\right)VIN - \left(\frac{R1+R2}{R2}\right)\Delta Vt \quad (2)$$

As is apparent from the expression (2), a voltage appears at the output terminal VOUT with a value lower by an offset voltage component of $((R1+R2)/R2)\Delta Vt$ than the value of $((R1+R2)/R2)VIN$ originally desired to be outputted.

Figure 3:
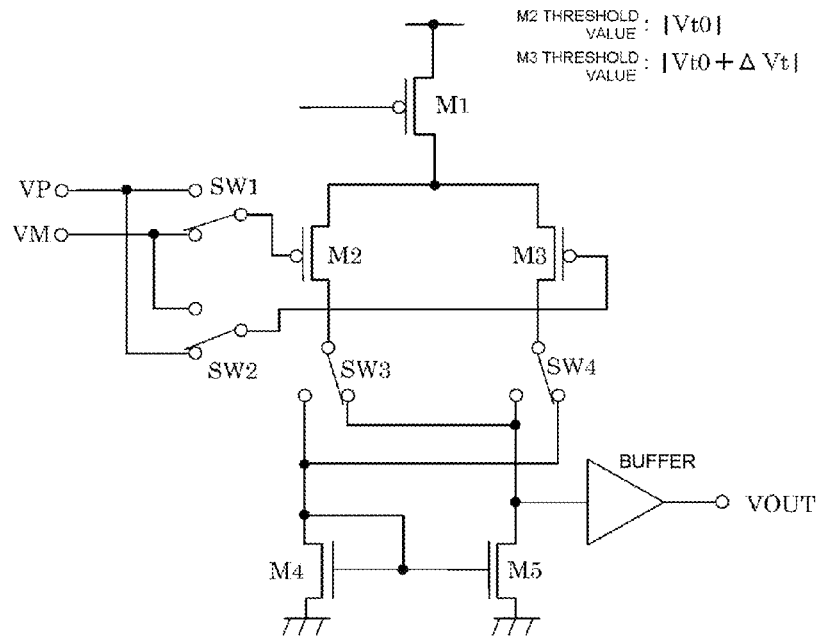
FIG. 3 is a circuit diagram (part 2) showing a circuit configuration of the auto-zero amplifier according to embodiments of the invention.
Figure 4:
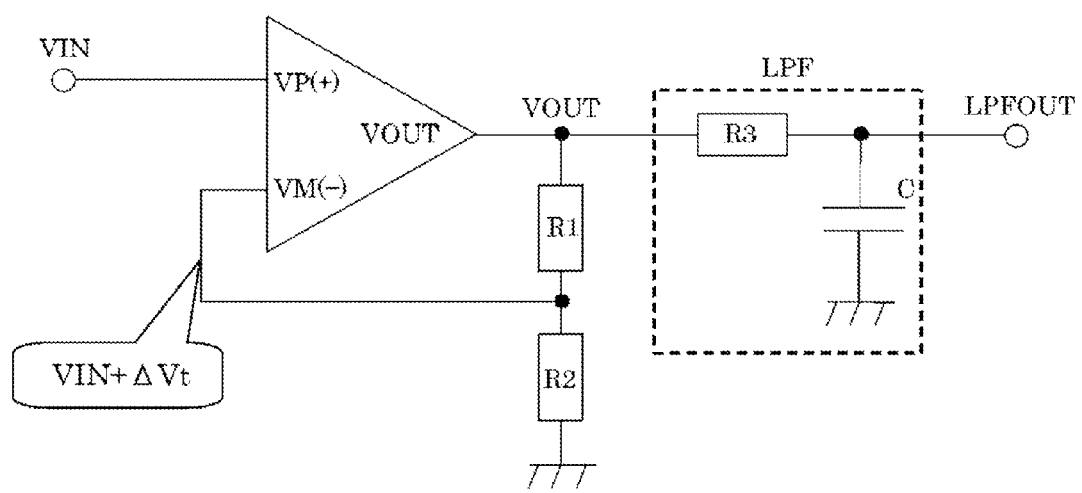
FIG. 4 is a circuit diagram (part 2) showing the whole configuration of a feedback amplifier circuit using the auto-zero amplifier shown in FIG. 3.

Next to this, a state 2 according to the operation of the auto-zero amplifier of the invention will be explained with the use of FIG. 3 and FIG. 4. FIG. 3 is a circuit diagram (part 2) showing the circuit configuration of the auto-zero amplifier according to an embodiment of the invention similarly to FIG. 1. FIG. 4 is a circuit diagram (part 2) showing the whole configuration of the feedback amplifier circuit using the auto-zero amplifier shown in FIG. 3. For sake of brevity, reference numerals and symbols used in FIG. 3 and FIG. 4, similar to those of FIG. 1 and FIG. 2, are omitted in the following explanation.

In the state 2 shown in FIG. 3 and FIG. 4, differing from the state 1 shown in FIG. 1 and FIG. 2 and explained in the foregoing, the second connection state and the fourth connection state are actualized, in which the non-inverting input terminal VP of the auto-zero amplifier is connected to the gate terminal of the transistor M3 forming the differential pair with the transistor M2 and the inverting input terminal VM of the auto-zero amplifier is connected to the gate terminal of the transistor M2 forming the differential pair.

Also, in the state 2 shown in FIG. 3 and FIG. 4, at a normal operation, the OP amplifier circuit has feedback applied from the output to the input so that currents equal to each other flow in the differential pair transistors M2 and M3, respectively. With respect to this, the case is the same as that in the state 1. In addition, for making the differential pair transistors M2 and M3 respectively have currents equal to each other flow therein when an input voltage VIN is applied to the non-inverting input terminal VP of the auto-zero amplifier, the auto-zero amplifier is operated so that a voltage higher by |ΔVt| than the voltage applied to the gate terminal of the transistor M3 is applied to the gate terminal of the transistor M2 to bring the currents in the transistors M2 and M3 into a well-balanced state. Consequently, to the inverting input terminal VM of the auto-zero amplifier shown in FIG. 4, feedback is to be applied from the output terminal VOUT so that a voltage VIN+|ΔVt| is applied. Namely, the relation between the output voltage VOUT at the output terminal VOUT of the auto-zero amplifier and the input voltage VIN is given by the following expression (3):

$$VOUT\left(\frac{R2}{R1+R2}\right) = VIN + \Delta Vt \quad (3)$$

Thus, the output voltage VOUT is given by the following expression (4):

$$VOUT = \left(\frac{R1+R2}{R2}\right)VIN + \left(\frac{R1+R2}{R2}\right)\Delta Vt \quad (4)$$

As is apparent from the expression (4), a voltage appears at the output terminal VOUT with a value higher by an offset voltage component of $((R1+R2)/R2)\Delta Vt$ than the value of $((R1+R2)/R2)VIN$ originally desired to be outputted.

Figure 5:
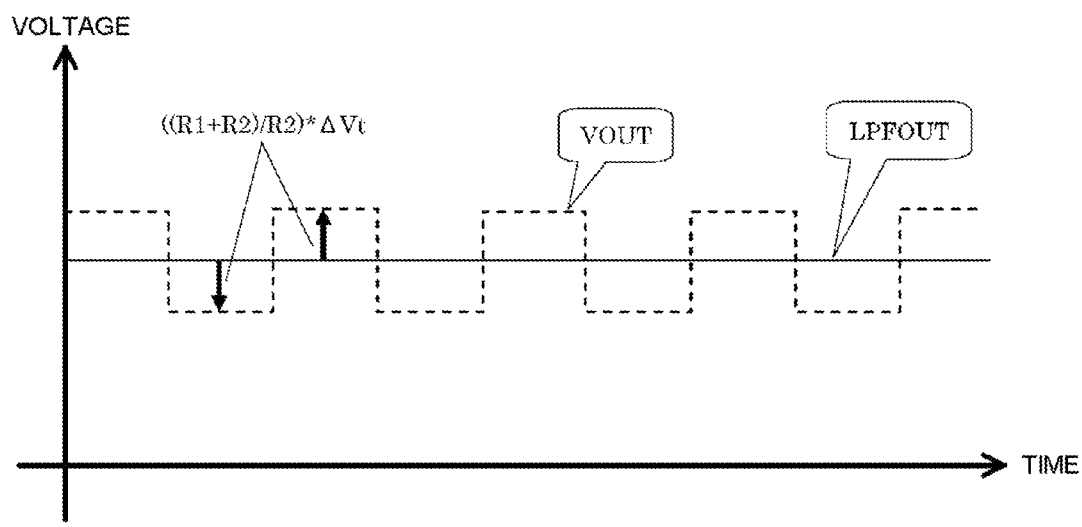
FIG. 5 is a waveform diagram showing waveforms at a node VOUT and at a node LPFOUT in the feedback amplifier circuit shown in FIG. 2 and FIG. 4, according to embodiments of the invention.

As was explained in the foregoing, by carrying out switching of the switches SW1, SW2, SW3 and SW4, the polarity of an offset voltage component is reversed which appear in the output voltage VOUT of an OP amplifier circuit. FIG. 5 is a waveform diagram showing waveforms at a node VOUT and at a node LPFOUT in the feedback amplifier circuit shown in FIG. 2 and FIG. 4 according to embodiments of the invention. By switching the switches every specified period of time, the output voltage of the OP amplifier circuit becomes an output voltage with ripples of a rectangular wave as is shown as VOUT in FIG. 5 with the amplitude of the ripple being two times the offset voltage multiplied by the gain of the OP amplifier circuit. Namely, the output voltage of the OP amplifier circuit becomes a signal in which positive and negative rectangular ripples with the values thereof being proportional to the value |ΔVt| are superimposed on a true value. The value in the middle of the rectangular ripples is the true value with offset voltages being canceled. By making the signal of the output voltage VOUT inputted to a low pass filter LPF shown in FIG. 2 and FIG. 4 and smoothed, the voltage of the true value can be obtained as an output voltage LPFOUT of the low-pass filter LPF with offset voltages being canceled.

Figure 6:
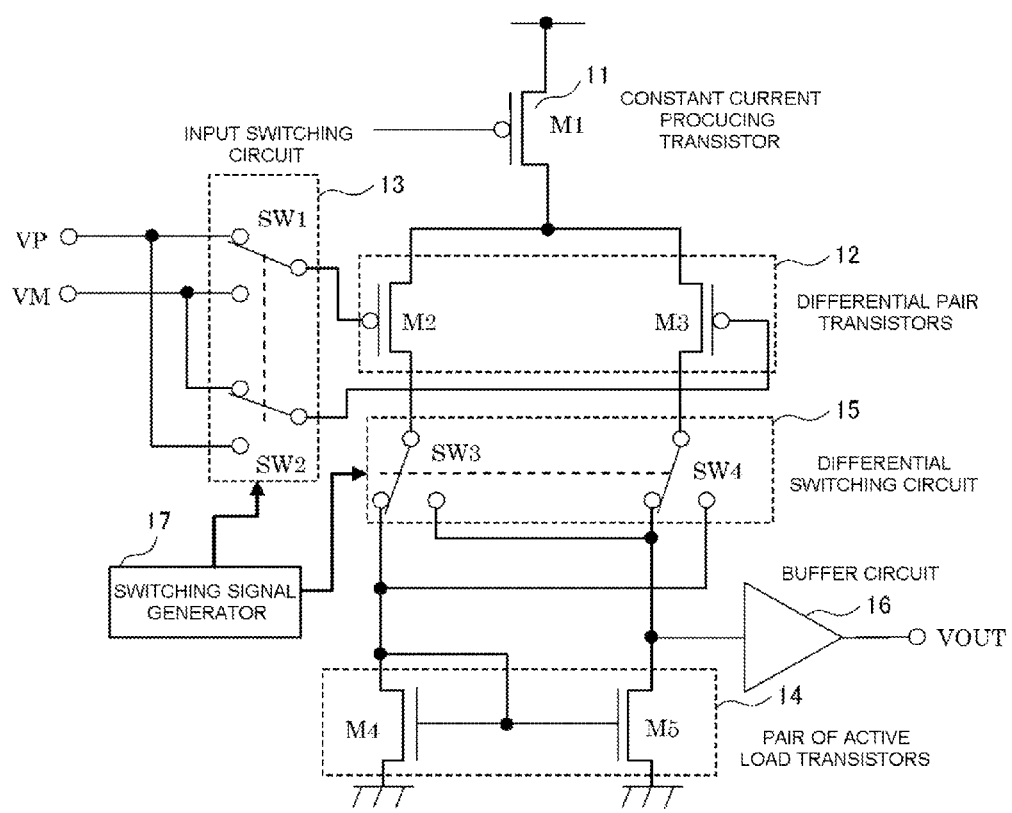
FIG. 6 is a circuit diagram showing the configuration of an OP amplifier circuit according to an embodiment of the invention.

FIG. 6 is a circuit diagram showing the configuration of an OP amplifier circuit according to a first aspect of the invention. Namely, the OP amplifier circuit according to the first aspect of the invention is provided so as to include: a non-inverting (+) input terminal VP and an inverting (−) input terminal VM; an output terminal VOUT; a constant current producing transistor (M1) 11; a differential pair of transistors 12 including a first transistor (MOSFET M2) and a second transistor (MOSFET M3) the source terminal of each of which is connected to the drain terminal of the constant current producing transistor 11 and which carry out a differential operation in a pair, the first transistor M2 and the second transistor M3 having the same conduction type as the conduction type of the constant current producing transistor M1; an input switching circuit 13 carrying out switching between a first connection state and a second connection state, the first connection state being a state in which the non-inverting input terminal VP is connected to the gate terminal of the first transistor M2 and, along with this, the inverting input terminal VM is connected to the gate terminal of the second transistor M3, and the second connection state being a state in which the inverting input terminal VM is connected to the gate terminal of the first transistor M2 and, along with this, the non-inverting input terminal VP is connected to the gate terminal of the second transistor M3;

Also included are a pair of active load transistors 14 including a third transistor (MOSFET M4) and a fourth transistor (MOSFET M5) the gate electrodes of which are connected to each other and one of which is in a diode connection, the third transistor M4 and the fourth transistor M5 having a different conduction type from the conduction type of the constant current producing transistor M1, the first transistor M2 and the second transistor M3; a differential switching circuit 15 carrying out switching between a third connection state and a fourth connection state, the third connection state being a state in which the drain terminal of the third transistor M4 is connected to the drain terminal of the first transistor M2 and, along with this, the drain terminal of the fourth transistor M5 is connected to the drain terminal of the second transistor M3, and the fourth connection state being a state in which the drain terminal of the third transistor M4 is connected to the drain terminal of the second transistor M3 and, along with this, the drain terminal of the fourth transistor M5 is connected to the drain terminal of the first transistor M2; a buffer circuit 16 connected to the drain terminal of the fourth transistor M5, outputting a voltage equal to the voltage inputted to the non-inverting input terminal VP, and transmitting the outputted voltage to the output terminal VOUT at low output impedance; and a switching signal generator 17 generating a signal for switching the connection state in the input switching circuit 13 and the connection state in the differential switching circuit 15 every specified period of time, the connection state in the input switching circuit 13 and the connection state in the differential switching circuit 15 being switched every specified period of time.

Figure 7:
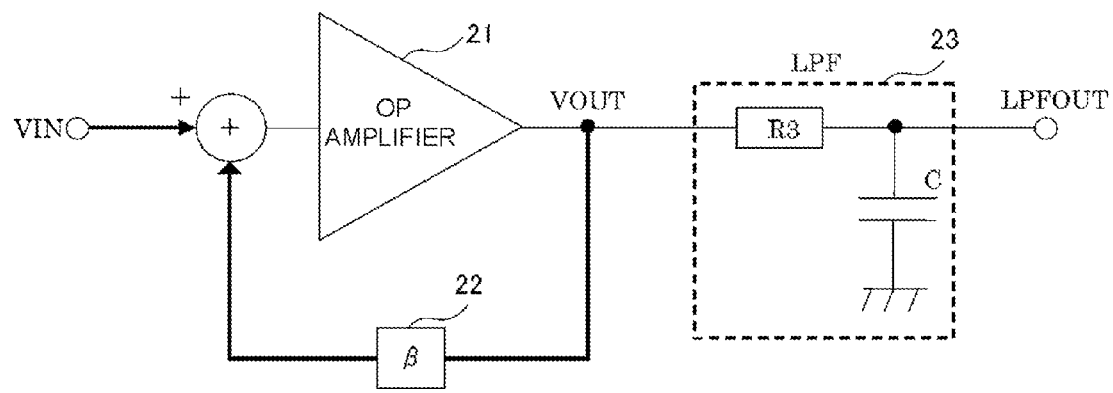
FIG. 7 is a circuit diagram showing the whole configuration of a feedback amplifier circuit according to embodiments of the invention.
Figure 8A:
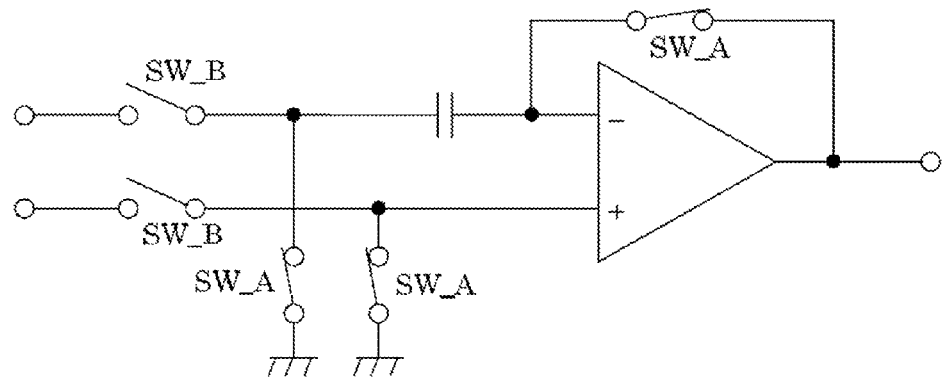
FIGS. 8(A)-8(C) are circuit diagrams showing a circuit configuration and operations of the circuit of an auto-zero amplifier according to related art.
Figure 8B:
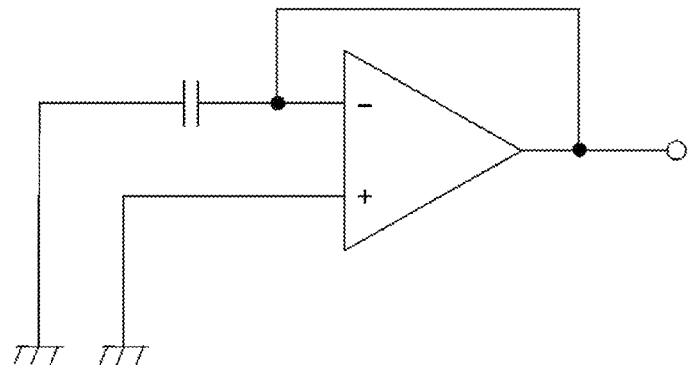
Figure 8C:
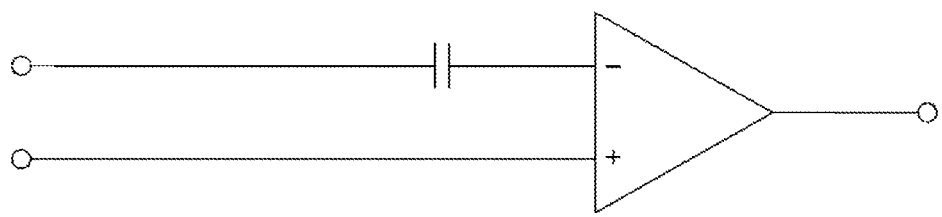

FIG. 7 is a circuit diagram showing a configuration of a feedback amplifier circuit according to a second aspect of the invention. Namely, the feedback amplifier circuit according to the second aspect is a feedback amplifier circuit using the OP amplifier circuit 21 according to the first aspect of the invention, the feedback amplifier circuit being provided so as to include: the OP amplifier circuit 21 according to the first aspect of the invention; a feedback means ($\beta$) 22 making the output voltage of the OP amplifier circuit 21 according to the first aspect of the invention fed back to the input section of the OP amplifier circuit 21; and a low-pass filter (LPF) 23 the time constant of which is determined to be larger than the switching period of switching the connection states in the OP amplifier circuit 21 for smoothing the output voltage of the OP amplifier circuit 21 according to the first aspect of the invention.

In the foregoing, explanations were made with respect to examples of feedback amplifier circuits using positive phase amplifier circuits. However, instead of the positive phase amplifier circuit, an inverting amplifier circuit and a differential amplifier circuit, as well as other configurations, as would be understood by one of skill in the art, can be used.

While the present invention has been particularly shown and described with reference to the preferred embodiment thereof, it will be understood by those skilled in the art that the foregoing and other changes in form and details can be made therein without departing from the spirit and scope of the present invention.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2011-269863, filed on Dec. 9, 2011. The disclosure of the priority application, in its entirety, including the drawings, claims, and the specification thereof, is incorporated herein by reference.

What is claimed is:

1. An operational amplifier circuit comprising:
a non-inverting input terminal and an inverting input terminal;
an output terminal;
a constant current producing transistor;
a differential pair of transistors comprising a first transistor and a second transistor the source terminals of which are connected to the drain terminal of the constant current producing transistor and which carry out a differential operation in a pair, the first transistor and the second transistor having the same conduction type as the conduction type of the constant current producing transistor;
an input switching circuit carrying out switching between a first connection state and a second connection state, the first connection state being a state in which the non-inverting input terminal is connected to the gate terminal of the first transistor and, along with this, the inverting input terminal is connected to the gate terminal of the second transistor, and the second connection state being a state in which the inverting input terminal is connected to the gate terminal of the first transistor and, along with this, the non-inverting input terminal is connected to the gate terminal of the second transistor;
a pair of active load transistors comprising a third transistor and a fourth transistor the gate electrodes of which are connected to each other and one of which is in a diode connection, the third transistor and the fourth transistor having a different conduction type from the conduction type of the constant current producing transistor, the first transistor and the second transistor;
a differential switching circuit carrying out switching between a third connection state and a fourth connection state, the third connection state being a state in which the drain terminal of the third transistor is connected to the drain terminal of the first transistor and, along with this, the drain terminal of the fourth transistor is connected to the drain terminal of the second transistor, and the fourth connection state being a state in which the drain terminal of the third transistor is connected to the drain terminal of the second transistor and, along with this, the drain terminal of the fourth transistor is connected to the drain terminal of the first transistor;
a buffer circuit connected to the drain terminal of the fourth transistor, outputting a voltage equal to the voltage of the drain terminal of the fourth transistor, and transmitting the outputted voltage to the output terminal at low output impedance; and
a switching signal generator generating a signal for switching the connection states in the input switching circuit and the connection states in the differential switching circuit every specified period of time,
the connection states in the input switching circuit and the connection states in the differential switching circuit being switched every specified period of time.

2. A feedback amplifier circuit comprising:
an operational amplifier circuit including:
- a non-inverting input terminal and an inverting input terminal;
- an output terminal;
- a constant current producing transistor;
- a differential pair of transistors comprising a first transistor and a second transistor the source terminals of which are connected to the drain terminal of the constant current producing transistor and which carry out a differential operation in a pair, the first transistor and the second transistor having the same conduction type as the conduction type of the constant current producing transistor;
- an input switching circuit carrying out switching between a first connection state and a second connection state, the first connection state being a state in which the non-inverting input terminal is connected to the gate terminal of the first transistor and, along with this, the inverting input terminal is connected to the gate terminal of the second transistor, and the second connection state being a state in which the inverting input terminal is connected to the gate terminal of the first transistor and, along with this, the non-inverting input terminal is connected to the gate terminal of the second transistor;
- a pair of active load transistors comprising a third transistor and a fourth transistor the gate electrodes of which are connected to each other and one of which is in a diode connection, the third transistor and the fourth transistor having a different conduction type from the conduction type of the constant current producing transistor, the first transistor and the second transistor;
- a differential switching circuit carrying out switching between a third connection state and a fourth connection state, the third connection state being a state in which the drain terminal of the third transistor is connected to the drain terminal of the first transistor and, along with this, the drain terminal of the fourth transistor is connected to the drain terminal of the second transistor, and the fourth connection state being a state in which the drain terminal of the third transistor is connected to the drain terminal of the second transistor and, along with this, the drain terminal of the fourth transistor is connected to the drain terminal of the first transistor;
- a buffer circuit connected to the drain terminal of the fourth transistor, outputting a voltage equal to the voltage of the drain terminal of the fourth transistor, and transmitting the outputted voltage to the output terminal at low output impedance; and
- a switching signal generator generating a signal for switching the connection states in the input switching circuit and the connection states in the differential switching circuit every specified period of time,
the connection states in the input switching circuit and the connection states in the differential switching circuit being switched every specified period of time;

the feedback amplifier circuit further comprising:
a feedback circuit configured to connect the output terminal of the operational amplifier circuit back to at least one of the non-inverting input terminal and the inverting input terminal of the operational amplifier circuit; and
a low-pass filter the time constant of which is larger than the specified period of time of the switching signal generator,
wherein the low-pass filter smoothes the outputted voltage of the operational amplifier circuit.

* * * * *